(12) United States Patent
Ma

(10) Patent No.: US 10,332,444 B2
(45) Date of Patent: Jun. 25, 2019

(54) SHIFT REGISTER UNIT AND DRIVING METHOD THEREOF, DRIVING CIRCUIT AND DISPLAY DEVICE

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 175 days.

(21) Appl. No.: 15/677,110

(22) Filed: Aug. 15, 2017

(65) Prior Publication Data

US 2018/0075800 A1 Mar. 15, 2018

(30) Foreign Application Priority Data

Sep. 9, 2016 (CN) .......................... 2016 1 0816081

(51) Int. Cl.
| | | |
|---|---|---|
| *G11C 19/00* | (2006.01) |
| *G09G 3/3225* | (2016.01) |
| *G11C 19/28* | (2006.01) |
| *G11C 19/18* | (2006.01) |
| *G09G 3/3266* | (2016.01) |
| *G09G 3/36* | (2006.01) |

(52) U.S. Cl.
CPC ......... *G09G 3/3225* (2013.01); *G09G 3/3266* (2013.01); *G11C 19/184* (2013.01); *G11C 19/28* (2013.01); *G09G 3/3677* (2013.01); *G09G 2310/0286* (2013.01)

(58) Field of Classification Search
None
See application file for complete search history.

(56) References Cited

U.S. PATENT DOCUMENTS

| | | | | |
|---|---|---|---|---|
| 2016/0133184 A1* | 5/2016 | Gupta | .................. | G09G 3/3233 345/690 |
| 2016/0293269 A1* | 10/2016 | Lim | ....................... | G11C 19/28 |
| 2016/0314745 A1* | 10/2016 | Hu | ........................ | G09G 3/3266 |
| 2017/0278466 A1* | 9/2017 | Yu | ......................... | G02F 1/1333 |
| 2017/0294166 A1* | 10/2017 | Kim | ..................... | G09G 3/3266 |
| 2018/0047344 A1* | 2/2018 | Sun | ........................ | G09G 3/34 |
| 2018/0090072 A1* | 3/2018 | Sun | ...................... | G09G 3/3258 |

(Continued)

FOREIGN PATENT DOCUMENTS

| | | |
|---|---|---|
| CN | 1758321 A | 4/2006 |
| CN | 101939791 A | 1/2011 |

*Primary Examiner* — Tuan T Lam
(74) *Attorney, Agent, or Firm* — Calfee, Halter & Griswold LLP

(57) ABSTRACT

A shift register unit is disclosed, including a first input module transmitting a first level voltage signal to a first node under control of a voltage signal of a second node; a reset module transmitting a second level voltage signal to the first node under control of an output signal of the present stage of shift register unit; a first output module outputting the second level voltage signal to the output terminal of the shift register unit under control of a voltage signal of the first node; a second input module receiving an input signal and transmitting the input signal to the second node under control of a clock signal; a storage capacitor maintaining the voltage of the second node while the second input module is turned off; and a second output module outputting the first level voltage signal to the output terminal.

15 Claims, 3 Drawing Sheets

(56) References Cited

U.S. PATENT DOCUMENTS

2018/0096732 A1* 4/2018 Cheng ............... G11C 19/28
2018/0114490 A1* 4/2018 Sun .................. G09G 3/3266
2018/0130542 A1* 5/2018 Li ..................... G09G 5/003

* cited by examiner

US 10,332,444 B2

SHIFT REGISTER UNIT AND DRIVING METHOD THEREOF, DRIVING CIRCUIT AND DISPLAY DEVICE

CROSS-REFERENCE TO RELATED APPLICATIONS

The present application claims priority to Chinese Patent Application No. 201610816081.1, filed Sep. 9, 2016, and the entire contents of which are incorporated herein by reference.

TECHNICAL FIELD

The present disclosure relates to the field of display technology, and more particularly to a shift register unit and driving method thereof, driving circuit and display device.

BACKGROUND

Organic Light Emitting Diode (OLED) displays have desirable characteristics of self-luminescence, high contrast, small thickness, wide view angle, fast response, flexibility, and wide applicable temperature range and simple fabrication, etc. Due to this reason, the OLED displays are considered as emerging technology of next generation flat displays.

A driving process for an OLED display generally includes a signal loading phase and a pixel luminescence phase. For the special timing requirement of the OLED display, it requires a constant-on type shift register in the pixel luminescence phase (luminescence control shift register) to control the pixel luminescence in a constant on state.

It should be noted that the information disclosed in the above-mentioned background section is provided only for a better understanding of the background of the present disclosure and may therefore contain information that does not form prior art known to those skilled in the art.

SUMMARY

The present disclosure provides a shift register unit and a driving method thereof, a driving circuit and a display device.

The technical solution of the embodiments of the present disclosure is as follows.

In one aspect, an embodiment of the present disclosure provides a shift register unit, including a first input module, a first output module, a second input module, a second output module, a storage capacitor and a reset module, wherein the first input module, the first output module and the reset module are connected together through a first node; the first input module, the second input module and the second output module are connected together through a second node; the storage capacitor has one terminal connected to the second node, and a second terminal connected to an output terminal of the shift register unit; the first input module is configured to receive a first level voltage signal, and under control of a voltage signal of the second node, transmit the first level voltage signal to the first node; the reset module is configured to receive a second level voltage signal, and under control of an output signal of the present stage of shift register unit, transmit the second level voltage signal to the first node; the first output module is configured to, under control of a voltage signal of the first node, output the second level voltage signal to the output terminal of the shift register unit; the second input module is configured to receive an input signal and under control of a clock signal, transmit the input signal to the second node; the storage capacitor is configured to maintain the voltage of the second node while the second input module is turned off; the second output module is configured to output the first level voltage signal to the output terminal of the shift register unit under control of a voltage signal of the second node; and one of the first level voltage signal and the second level voltage signal is a low level voltage signal, and the other is a high level voltage signal.

An embodiment of the present disclosure also provides a driving circuit, including a plurality of cascaded shift register units, each of the shift register units being any of the above described shift register unit.

An embodiment of the present disclosure also provides a display device, provided with the above described driving circuit.

In another aspect, an embodiment of the present disclosure provides a driving method for a shift register unit, applicable for the above described shift register unit, the first level voltage signal being a high level voltage signal, and the second level voltage signal being a low level voltage signal, the driving method including: at a first phase, the input signal outputting a low level voltage, the clock signal outputting a low level voltage, the second input module transmitting a low level voltage signal to the second node and charging the storage capacitor to a low level voltage under control of the clock signal, the second output module outputting a low level voltage to the output terminal of the shift register unit under effect of the low level voltage of the second node, and the output terminal outputting a low level voltage to cause the reset module to turn off the first output module; at a second phase, both of the input signal and the clock signal outputting high level voltages, the high level voltage of the clock signal causing the second input module to be turned off, and to stop transmitting a signal to the second node, due to the presence of the storage capacitor, the second node still maintaining the low level voltage, the second output module continuing to output a low level voltage to the output terminal, and the output terminal outputting a low level voltage to cause the reset module to turn off the first output module; at a third phase, the input signal outputting a high level voltage, the clock signal CLK outputting a low level voltage, the second input module transmitting a high level voltage signal to the second node and charging the storage capacitor to a high level voltage under effect of the low level voltage of the clock signal, under effect of the high level voltage of the second node, the second output module being turned off, at the same time, the first input module transmitting a low level voltage signal to the first node, the first output module outputting a high level voltage to the output terminal of the shift register unit under effect of the low level voltage of the first node, and the output terminal outputting a high level voltage to turn off the reset module; at a fourth phase, the input signal outputting a high level voltage, the clock signal outputting a high level voltage, the high level voltage of the clock signal causing the second input module to be turned off and to stop transmitting a signal to the second node, due to the presence of the storage capacitor, the second node still maintaining the high level voltage, and the first output module continuing to output a high level voltage to the output terminal of the shift register unit; at a fifth phase, the input signal outputting a high level voltage, the clock signal alternately outputting a low level voltage and a high level voltage, similarly to the third phase and the fourth phase, the first output module continuing to output a high level voltage to the output terminal of the shift register unit till the input signal finishes outputting a high level voltage; at a sixth phase, the input signal outputting a low level voltage, when the clock signal outputs a high level voltage, the high level voltage of the clock signal turning off the second input module, due to the presence of the storage capacitor, the second node still maintaining the high level voltage from the previous phase; the first output module continuing to output a high level voltage to the output terminal, subsequently, when the input signal continues to output a low level voltage, the clock signal outputting a low level voltage or a high level voltage, similarly to the first phase or the second phase, the second output module outputting a low level voltage to the output terminal; and when the input signal outputs a low level voltage, and the clock signal outputs a low level voltage, similarly to the first phase, the second output module outputting a low level voltage to the output terminal, subsequently, when the input signal continues to output a low level voltage, the clock signal outputting a high level voltage or a low level voltage, similarly to the second phase or the first phase, the second output module continuing to output a low level to the output terminal;

alternatively, when the first level voltage signal is a low level voltage signal, and the second level voltage signal is a high level voltage signal, the driving method includes: at a first phase, the input signal outputting a low level voltage, the clock signal outputting a high level voltage, the second input module transmitting a low level voltage signal to the second node and charging the storage capacitor to a low level voltage under effect of the high level voltage of the clock signal, the second output module turning off, and the first input module outputting a high level voltage to the first node under effect of the low level voltage of the second node, the first output module outputting a low level voltage to the output terminal of the shift register unit under effect of the high level voltage of the first node, the output terminal outputting a low level voltage to turn off the reset module; at a second phase, the input signal outputting high level voltages, and the clock signal outputting a low level voltage, the low level voltage of the clock signal turning off the second input module, due to the presence of the storage capacitor, the second node still maintaining the low level voltage, the second output module continuing to be turned off, and the first output module continuing to output a low level voltage to the output terminal; at a third phase, the input signal outputting a high level voltage, the clock signal CLK outputting a high level voltage, the second input module transmitting a high level voltage signal to the second node and charging the storage capacitor to a high level voltage under effect of the high level voltage of the clock signal, under effect of the high level voltage of the second node, the first input module being turned off; the second output module outputting a high level voltage to the output terminal, and the high level voltage outputted by the output terminal causing the reset module to turn off the first output module; at a fourth phase, the input signal outputting a high level voltage, the clock signal outputting a low level voltage, the low level voltage of the clock signal causing the second input module to be turned off, due to the presence of the storage capacitor, the second node NET2 still maintaining the high level voltage, the second output module continuing to output a high level voltage to the output terminal, and the high level voltage outputted by the output terminal causing the reset module to continue to turn off the first output module; at a fifth phase, the input signal outputting a high level voltage, the clock signal alternately outputting a high level voltage and a low level voltage, similarly to the third phase and the fourth phase, the second output module continuing to output a high level voltage to the output terminal of the shift register unit till the input signal finishes outputting a high level voltage; at a sixth phase, the input signal outputting a low level voltage, when the clock signal outputs a high level voltage, the high level voltage of the clock signal causing the second input module to output a low level voltage to the second node, the second output module being turned off, the first output module outputting a low level voltage to the output terminal, subsequently, when the input signal outputs a low level voltage, the clock signal outputting a low level voltage or a high level voltage, similarly to the second phase or the first phase, and the first output module outputting a low level voltage to the output terminal of the shift register unit; and when the input signal outputs a low level voltage, and the clock signal outputs a low level voltage, due to the presence of the storage capacitor, the second node still maintaining the high level voltage from the previous phase, the second output module continuing to output a high level voltage to the output terminal, subsequently, when the input signal outputs a low level voltage, the clock signal outputting a high level voltage or a low level voltage, and similarly to the first phase or the second phase, the first output module continuing to output a low level to the output terminal.

It should be understood that, the general description above and the detailed description below are merely exemplary, and do not limit the present disclosure.

This section provides an overview of the various implementations or examples of the techniques described in the present disclosure, and is not intended to be exhaustive of the full scope of the present disclosed technology or all features.

BRIEF DESCRIPTION OF THE DRAWINGS

In order to more clearly illustrate the technical solution in the embodiments of the present disclosure, the drawings, which are intended to be used in the description of the embodiments, will be briefly described below. It will be apparent that the drawings in the following description are merely examples of the present disclosure, and other drawings may be obtained by those skilled in the art without making creative work.

NUMERAL REFERENCES

11—First Input Module; 12—First Output Module; 13—Second Input Module; 14—Second Output Module; 15—Reset Module; C—Storage Capacitor; NET1—First Node; NET2—Second Node.

DETAILED DESCRIPTION

The technical solutions in the embodiments of the present disclosure will be described clearly and thoroughly in conjunction with the accompanying drawings. Apparently, the described embodiments are merely part of the embodiments of the present disclosure and are not intended to be exhaustive. Based on embodiments in the present disclosure, all other embodiments obtained by those of ordinary skill in the art without making creative work fall within the protective scope of the present disclosure.

Embodiment

Figure 1:
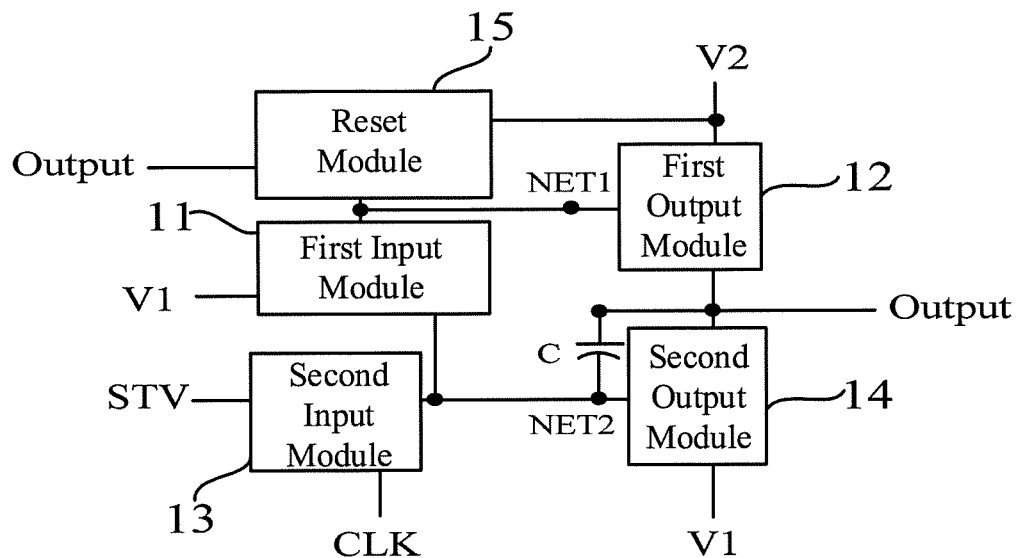
FIG. 1 is a block diagram of a shift register unit provided by an embodiment of the present disclosure.

An embodiment of the present disclosure provides a shift register unit. As shown in FIG. 1, the shift register unit includes a first input module 11, a first output module 12, a second input module 13, a second output module 14, a storage capacitor C and a reset module 15. The first input module 11, the first output module 12 and the reset module 15 are connected together through a first node NET1. The first input module 11, the second input module 13 and the second output module 14 are connected together through a second node NET2. The storage capacitor C has one terminal connected to the second node NET2, and a second terminal connected to an output terminal (denoted by "Output" in the figure, and unless otherwise specified, the output terminal herein refers to an output terminal of the present stage of shift register unit). The first input module 11 is configured to receive a first level voltage signal V1, and under control of a voltage signal of the second node NET2, transmit the first level voltage signal V1 to the first node NET1. The reset module is configured to receive a second level voltage signal V2, and under control of an output signal of the present stage of shift register unit, transmit the second level voltage signal V2 to the first node NET1. The first output module 12 is configured to, under control of a voltage signal of the first node NET1, output the second level voltage signal V2 to the output terminal (Output) of the shift register unit. The second input module 13 is configured to receive an input signal (for the first stage of shift register unit, the input signal is a frame start signal STV, as exemplified in FIGS. 1-6) and under control of a clock signal CLK, transmit the input signal to the second node NET2. The storage capacitor C is configured to maintain the voltage of the second node NET2 while the second input module 13 is turned off. The second output module 14 is configured to output the first level voltage signal V1 to the output terminal (Output) of the shift register unit under control of a voltage signal of the second node NET2. One of the above first level voltage signal V1 and the second level voltage signal V2 is a low level voltage signal, and the other is a high level voltage signal.

In an optional specific implementation, each of these modules has a first terminal and a second terminal for inputting and outputting signals, and a control terminal for inputting a control signal controlling the signal process procedure. Specifically, as shown in FIG. 1, the first terminal of the first input module 11 receives the first level voltage signal V1. The second terminal of the first input module 11 connected to the control terminal of the first output module 12 through the first node NET1. The control terminal of the first input module 11 is connected to the second node NET2. The first terminal of the first output module 12 receives the second level voltage signal V2. The second terminal of the first output module 12 is connected to the output terminal (Output) of the shift register unit. The first terminal of the second input module 13 receives an input signal. The second terminal of the second input module 13 is connected to the control terminal of the second input module 13 through the second node NET2. The control terminal of the second input module 13 receives the clock signal CLK. The first terminal of the second output module 14 receives the first level voltage signal V1. The second terminal of the second output module 14 is connected to the output terminal (Output) of the shift register unit. The first terminal of the reset module 15 receives the second level voltage signal V2. The second terminal of the reset module 15 is connected to the first node NET1. The control terminal of the reset module 15 is connected to the output terminal (i.e. an output signal Output is inputted to the control terminal of the reset module 15) of the present stage of shift register unit.

In the shift register unit provided by the present embodiment, the first input module 11 is connected to the first output module 12 through the first node NET1. The first input module 11, the second input module 13 and the second output module 14 are connected together through the second node NET2. The first input module 11 and the reset module transmit signals to the first node NET1, to control the level of the first node NET1 to be high or low. The second input module 13 is configured to transmit a signal to the second node NET2, to control the level of the second node NET2 to be high or low. Both of the first output module 12 and the second output module 14 are connected to the output terminal (Output) of the shift register unit. The first output module 12 outputs a signal to the output terminal (Output) of the shift register unit under control of the level signal of the first node NET1. The second output module 14 outputs a signal to the output terminal (Output) of the shift register unit under control of the level signal of the second node NET2. At last, the output terminal (Output) outputs an output signal that satisfies the requirement. The second node NET2 is also connected to the first input module 11, and the voltage of the second node NET2 may also control the first input module 11 to be turned on and off.

In the shift register unit provided by the present embodiment, when the output terminal outputs a non-effective level (an effective level voltage of the output signal controls the pixel luminescence in a constant on state, if the effective level voltage is a high level voltage, the non-effective level voltage is a low level voltage), the level of the first node NET1 is raised, that is, to reset the first node NET1.

Figure 3:
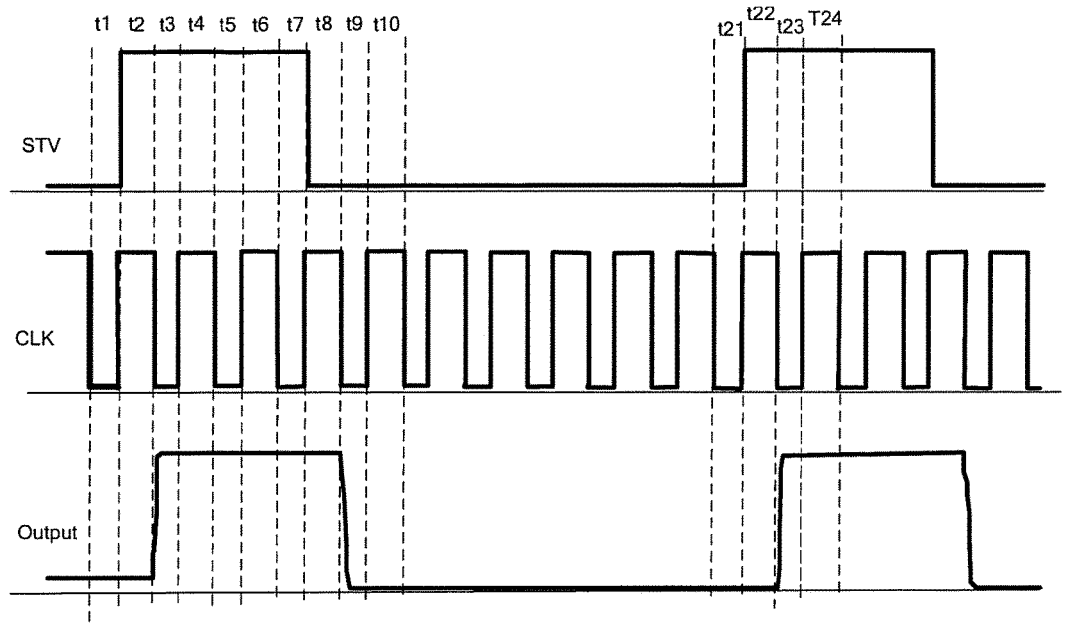
FIG. 3 is a driving timing diagram of the shift register unit as shown in FIG. 2.

An embodiment of the present disclosure also provides a driving method for the shift register unit, which is applicable for the above shift register unit. When the first level voltage signal V1 is a low level voltage signal VGL, the second level voltage signal V2 is a high level voltage signal VGH, the timing of the operation of the above shift register unit is as shown in FIG. 3. For a plurality of cascaded shift register units, an input signal of the first stage of shift register unit is a frame start signal STV, and an input signal of the second stage of shift register unit is an output signal of the previous stage of shift register unit (for example, an input signal of the second stage of shift register unit is an output signal of the first stage of shift register unit). In addition, the above shift register may also be applied in other circuits, the specific operation and its driving timing and method are substantially the same and may be referred to each other, which will not be repeated herein.

Referring to FIG. 3, the driving method for the above shift register unit includes the following phases.

At a first phase t1: when the input signal (corresponding to the frame start signal STV in the figure, and the same is applied to the discussion below) outputs a low level voltage, the clock signal CLK outputs a low level voltage, the second input module 13 transmits a low level voltage signal to the second node NET2 and charge the storage capacitor C to a low level voltage under control of the clock signal CLK. The second output module 14 outputs a low level voltage to the output terminal (Output) of the shift register unit under effect of the low level voltage of the second node NET2. The output terminal (Output) outputs a low level voltage to activate the reset module 15, such that the reset module 15 turns off the first output module 12.

At a second phase t2, both of the input signal and the clock signal CLK output high level voltages. The high level voltage of the clock signal CLK causes the second input module 13 to be turned off, and to stop transmitting a signal to the second node NET2. However, due to the presence of the storage capacitor C, the second node NET2 still maintains the low level voltage. The second output module 14 continues to output a low level voltage to the output terminal (Output). The output terminal (Output) outputs a low level voltage which continues to cause the reset module 15 to turn off the first output module 12.

At a third phase t3, the input signal outputs a high level voltage, the clock signal CLK outputs a low level voltage. The second input module 13 transmits a high level voltage signal VGH to the second node NET2 and charges the storage capacitor C to a high level voltage under effect of the low level voltage of the clock signal CLK. Under effect of the high level voltage of the second node NET2, the second output module 14 is turned off. At the same time, the first input module 11 transmits a low level voltage signal to the first node NET1. The first output module 12 outputs a high level voltage to the output terminal (Output) of the shift register unit under effect of the low level voltage of the first node NET1. The output terminal (Output) outputs a high level voltage and turn off the reset module 15.

At a fourth phase t4, the input signal outputs a high level voltage, the clock signal CLK outputs a high level voltage. The high level voltage of the clock signal CLK caused the second input module 13 to be turned off and to stop transmitting a signal to the second node NET2. However, due to the presence of the storage capacitor C, the second node NET2 still maintains the high level voltage. The first output module 12 continues to output a high level voltage to the output terminal (Output) of the shift register unit.

At a fifth phase t5~t7, the input signal outputs a high level voltage, the clock signal CLK alternately outputs a low level voltage and a high level voltage. Similarly to the third phase and the fourth phase (t3, t4), the first output module 12 continues to output a high level voltage to the output (Output) terminal of the shift register unit till the input signal finishes outputting a high level voltage.

At a sixth phase t8, the input signal outputs a low level voltage. If the clock signal CLK outputs a high level voltage, the high level voltage of the clock signal CLK turns off the second input module 13. Due to the presence of the storage capacitor C, the second node NET2 still maintains the high level voltage from the previous phase. The first output module 12 continues to output a high level voltage to the output terminal (Output). Subsequently, if the input signal continues to output a low level voltage, the clock signal CLK outputs a low level voltage or a high level voltage. Similarly to the first phase t1 or the second phase t2, the second output module 14 outputs a low level voltage to the output terminal (Output). At the sixth phase t8, the input signal outputs a low level voltage. If the clock signal CLK outputs a low level voltage, similarly to the first phase t1, the second output module 14 outputs a low level voltage to the output terminal (Output). Subsequently, if the input signal continues to output a low level voltage, the clock signal CLK outputs a high level voltage or a low level voltage. Similarly to the second phase t2 or the first phase t1, the second output module 14 continues to output a low level to the output terminal (Output).

Figure 5:
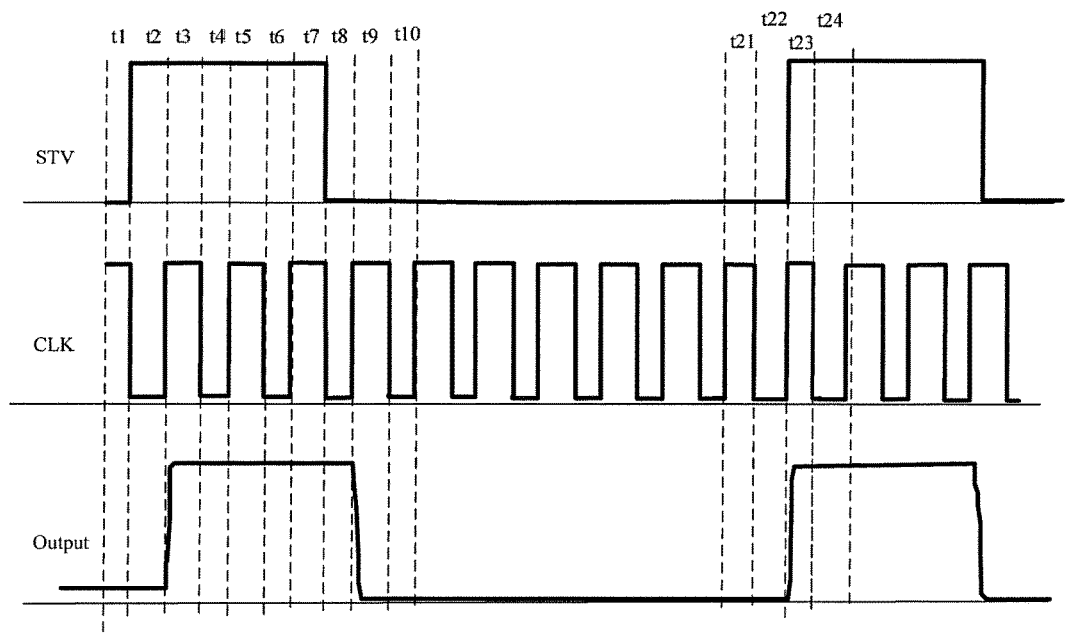
FIG. 5 is a first timing diagram of the shift register unit as shown in FIG. 4.

When the first level voltage signal V1 is a high level voltage signal VGH, and the second level voltage signal V2 is a low level voltage signal VGL. Referring to FIG. 5, the driving method according to the present embodiment includes the following phases.

At a first phase t1: when the input signal outputs a low level voltage, the clock signal CLK outputs a high level voltage, the second input module 13 transmits a low level voltage signal VGL to the second node NET2 and charge the storage capacitor C to a low level voltage under effect of the high level voltage of the clock signal CLK. The second output module 14 is turned off, and the first input module 11 outputs a high level voltage to the first node NET1 under effect of the low level voltage of the second node NET2. The first output module 12 outputs a low level voltage to the output terminal (Output) of the shift register unit under effect of the high level voltage of the first node NET1. The output terminal (Output) outputs a low level voltage to turn off the reset module 15.

At a second phase t2, the input signal outputs a high level voltage, and the clock signal CLK outputs a low level voltage. The low level voltage of the clock signal CLK turns off the second input module 13. However, due to the presence of the storage capacitor C, the second node NET2 still maintains the low level voltage. The second output module 14 continues to be turned off, the first output module 12 continues to output a low level voltage to the output terminal (Output).

At a third phase t3, the input signal outputs a high level voltage, the clock signal CLK outputs a high level voltage. The second input module 13 transmits a high level voltage signal to the second node NET2 and charges the storage capacitor C to a high level voltage under effect of the high level voltage of the clock signal CLK. Under effect of the high level voltage of the second node NET2, the first input module 11 is turned off. The second output module 14 outputs a high level voltage to the output terminal (Output). The high level voltage outputted by the output terminal (Output) causes the reset module 15 to turn off the first output module 12.

At a fourth phase t4, the input signal outputs a high level voltage, the clock signal CLK outputs a low level voltage. The low level voltage of the clock signal CLK caused the second input module 13 to be turned off. However, due to the presence of the storage capacitor C, the second node NET2 still maintains the high level voltage. The second output module 14 continues to output a high level voltage to the output terminal (Output).

At a fifth phase (corresponding to t5~t7 shown in FIG. 5), the input signal outputs a high level voltage, the clock signal CLK alternately outputs a high level voltage and a low level voltage. Similarly to the third phase and the fourth phase, the second output module 14 continues to output a high level voltage to the output (Output) terminal of the shift register unit till the input signal finishes outputting a high level voltage.

Figure 6:
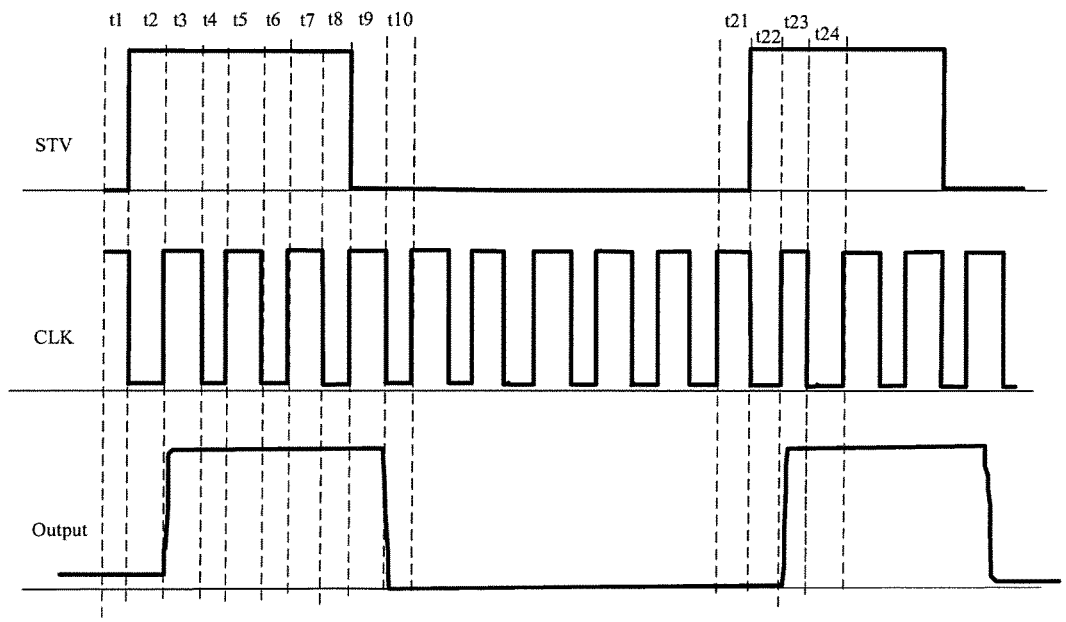
FIG. 6 is a second timing diagram of the shift register unit as shown in FIG. 4.

At a sixth phase (corresponding to t8 shown in FIG. 5), the input signal outputs a low level voltage. If the clock signal CLK outputs a high level voltage, the high level voltage of the clock signal CLK causes the second input module 13 to output a low level voltage to the second node NET2. The second output module 14 is turned off. The first output module 12 outputs a low level voltage to the output terminal (Output). Subsequently, if the input signal outputs a low level voltage, the clock signal CLK outputs a low level voltage or a high level voltage (t9~t21). Similarly to the second phase or the first phase, the first output module 12 outputs a low level voltage to the output terminal (Output) of the shift register unit. In addition, as shown in FIG. 6, at the sixth phase t8, the input signal outputs a low level voltage. If the clock signal CLK outputs a low level voltage, due to the presence of the storage capacitor C, the second node NET2 still maintains the high level voltage from the previous phase. The second output module 14 continues to output a high level voltage to the output terminal (Output). Subsequently, if the input signal outputs a low level voltage, the clock signal CLK outputs a high level voltage or a low level voltage. Similarly to the first phase or the second phase, the first output module 12 continues to output a low level to the output terminal (Output).

The shift register unit and the driving method thereof provided by the present disclosure has a simple structure, and may achieve the objective of flexibly controlling pixel timing and the display effect, by adjusting the pulse width of the STV trigger signal to control the width of the waveform. Moreover, compared to the structure of the conventional constant-on type shift register unit, the structure of the shift register unit of the present disclosure may eliminate the instability of the signal from the control terminal of the high-level control circuit caused by jump of the control clock, and may improve the stability of the outputted high-level signals. However, it should be understood by those skilled in the art that, the above first input module 11, the first output module 12, the second input module 13, the second output module 14 and the reset module 15 have various specific implementations, which will not be limited by the present embodiment, and could be any of the implementations known to those skilled in the art.

Figure 2:
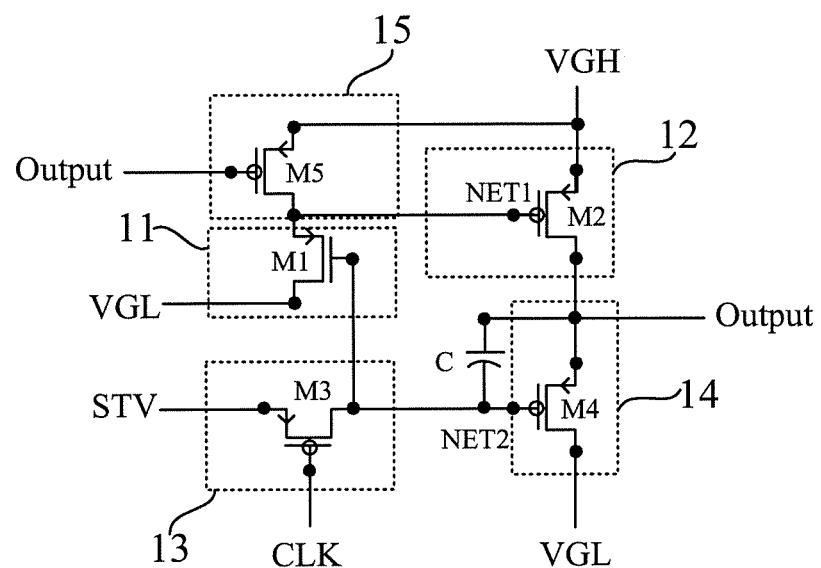
FIG. 2 is a schematic structural diagram of a detailed shift register unit provided by an embodiment of the present disclosure.
Figure 4:
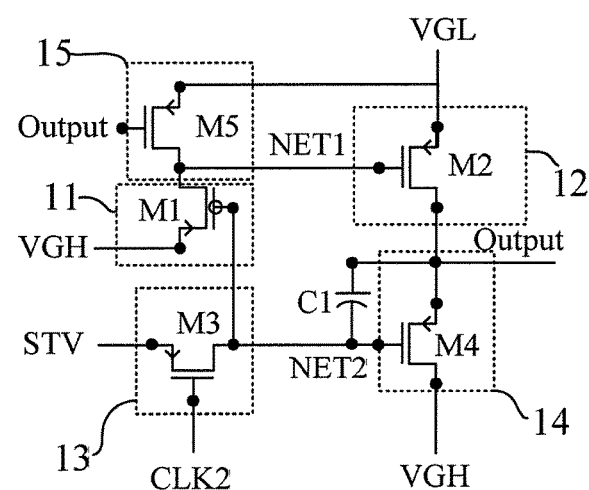
FIG. 4 is a schematic structural diagram of another detailed shift register unit provided by an embodiment of the present disclosure.

For example, optionally, the first output module 12, the second input module 13, the second output module 14 and the reset module 15 are implemented as thin film transistors of the same doped type. The first input module 11 is implemented as a thin film transistor of a different doped type from that of the first output module 12, the second input module 13, the second output module 14 or the reset module 15. Referring to FIGS. 2 and 4, the above module may be implemented by a proper doped type of thin film transistors. Eventually, the shift register unit according to the present disclosure may be implemented as 5 thin film transistors, simplifying the structure.

Referring to FIGS. 2 and 3, it is assumed that the first level voltage signal V1 is a low level voltage signal VGL, the second level voltage signal V2 is a high level voltage signal VGH, the first output module 12, the second input module 13, the second output module 14 and the reset module 15 are implemented as P type thin film transistors, and the first input module 11 is implemented as an N type thin film transistor. In this case, if the second node NET2 is at a high level voltage, the P type thin film transistor of the second output module 14 is turned off, the N type thin film transistor of the first input module 11 is turned on to output a low level voltage to the first node NET1, such that the P type thin film transistor of the first output module 12 is turned on to output a high level voltage to the output terminal (Output). The high level voltage outputted by the output terminal causes the P type thin film transistor of the reset module 15 to be turned off. If the second node NET2 is at a low level voltage, the N type of thin film transistor of the first input module 11 is turned off, the P type of thin film transistor of the second output module 14 is turned on to output a low level voltage to the output terminal (Output). The low level voltage outputted by the output terminal (Output) causes the P type of thin film transistor of the reset module 15 to be turned on to output a high level voltage to the first node NET1, such that the P type of thin film transistor of the first output module 12 to be turned off.

Referring to FIGS. 4 and 5, it is assumed that the first level voltage signal V1 is a high level voltage signal VGH, the second level voltage signal V2 is a low level voltage signal VGL, the first output module 12, the second input module 13, the second output module 14 and the reset module 15 are implemented as N type thin film transistors, and the first input module 11 is implemented as a P type thin film transistor. In this case, if the second node NET2 is at a high level voltage, the P type thin film transistor of the first input module 11 is turned off, the N type thin film transistor of the second output module 14 is turned on to output a high level voltage to the output terminal (Output). The high level voltage outputted by the output terminal (Output) causes the N type thin film transistor of the reset module 15 to be turned on to output a low level voltage to the first node NET1, such that the N type thin film transistor of the first output module 12 is turned off. If the second node NET2 is at a low level voltage, the N type of thin film transistor of the second output module 14 is turned off, the P type of thin film transistor of the first input module 11 is turned on to output a high level voltage to the first node NET1, such that the N type thin film transistor of the first output module 12 is turned on to output a low level voltage to the output terminal (Output). The low level voltage outputted by the output terminal (Output) causes the N type of thin film transistor of the reset module 15 to be turned off.

In order for those skilled in the art to better understand the shift register unit and the driving method thereof provided by the embodiments of the present disclosure, hereinafter the shift register unit provided by the present disclosure will be described in detail with reference to specific embodiments.

As shown in FIG. 2, the present embodiment provides constant-on type output CMOS shift register unit, including a first input module 11, a first output module 12, a second input module 13, a second output module 14, a storage capacitor C and a reset module 15. In the embodiment, the first output module 12, the second input module 13, the second output module 14 and the reset module 15 are implemented as P type thin film transistors. The first input module 11 is implemented as an N type thin film transistor. In the embodiment, the first level voltage signal V1 is a low level voltage signal VGL, and the second level voltage signal V2 is a high level voltage signal VGH.

Specifically, the first input module 11 includes an N type first thin film transistor M1, which has a first terminal inputted with a low level voltage signal VGL, a second terminal connected to the first node NET1, and a control terminal connected to the second node NET2. The first output module 12 includes a P type second thin film transistor M2, which has a first terminal inputted with a high level voltage signal VGH, a second terminal connected to the output terminal (Output) of the shift register unit, and a control terminal connected to the first node NET1. The second input module 13 includes a P type third thin film transistor M3, which has a control terminal inputted with the clock signal CLK, a first terminal inputted with an input signal, and a second terminal connected to the second node NET2. The second module 14 includes a P type fourth thin film transistor M4, which has a first terminal receiving a low level voltage signal VGL, a second terminal connected to the output terminal (Output) of the shift register unit, and a control terminal connected to the second node NET2. The reset module 15 includes a P type fifth thin film transistor M5, which has a first terminal inputted with a high level voltage signal VGH, a second terminal connected to the first node NET1, and a control terminal connected to the output terminal (Output) of the shift register unit.

Hereinafter, the operation principle of the CMOS shift register unit will be introduced. In the example, the transistors M2, M3, M4 and M5 are PMOS structures, and M1 is a NMOS structure. As shown in FIG. 3, the specific driving process, for example, of the shift register unit, is as follows.

At a phase t1, both of STV and CLK are low level voltage signals. Thus, the PMOS transistor M3 controlled by CLK is turned on, to transmit the low level voltage signal of STV to a gate electrode (i.e. the control terminal) of the PMOS transistor M4 and to charge the capacitor C. Then, M4 is turned on to transmit the low level signal VGL to the output terminal Output. Moreover, since M1 is an NMOS transistor, M1 is in a turned off state. At this time, the PMOS transistor M5 controlled by the output terminal Output is turned on, to write the high level signal VGH to the first node NET1, such that the PMOS transistor M2 is in a turned off state. Then, the VGH signal of the source electrode (i.e. the first terminal) of M2 will not affect the low level voltage output of the output terminal Output.

At a phase t2, both of STV and CLK are high level voltage signals. Thus, the PMOS transistor M3 controlled by CLK is turned off. The second node NET2 maintains the low level voltage signal from the phase t1 through the capacitor C, such that M4 is in a constant on state. The VGL signal is continuously written to the output terminal Output. Moreover, since M1 is also in a constant off state, M5 controlled by the output terminal Output is in a constant on state at the same time, to continuously write the VGH signal to the gate electrode (i.e. the control terminal) of M2, such that M2 is in a constant off state.

At a phase t3, STV is at a high level voltage signal, CLK is at a low level voltage signal. At this time, the PMOS transistor M3 controlled by CLK is turned on, to write the high level voltage signal of the STV to the second node NET2, and charge the capacitor C with the high level voltage signal. Then, the second node NET2 controls the PMOS transistor M4 to be in a turned off state, and the NMOS transistor M1 in a turned on state, to write the VGL signal to the first node NET1. Thus, the PMOS transistor M2 controlled by the NET1 is turned on, to input the VGH signal to the output terminal Output. Then, the PMOS transistor M5 controlled by the output terminal Output is in a turned off state. Thus, the VGH signal of the M5 source electrode (i.e. the first terminal) will not affect the low level voltage signal on the first node NET1, to ensure the stable output of M2.

At a phase t4, both of STV and CLK are high level voltage signals. Thus, the PMOS transistor M3 controlled by CLK is in a turned off state. The high level voltage signal stored in the capacitor C at the phase t3 constantly keeps the PMOS transistor M4 to be turned off, and constantly keeps the NMOS transistor M1 to be turned on, to continuously write the VGL signal to the first node NET1. It may ensure that the PMOS transistor M2 is constantly turned on, to continuously write the VGH signal to the output terminal Output, and the PMOS transistor M5 controlled by the output terminal Output is also in a constant off state.

A phase t5 has the same operation principle with the phase t3.

A phase t6 has the same operation principle with the phase t4.

A phase t7 has the same operation principle with the phase t3. Therefore, the pulse width of the high voltage of the STV signal may be depending on the number of the above phases that have been repeated.

At a phase t8, STV is a low level voltage signal, and CLK is a high level voltage signal. Thus, the PMOS transistor M3 controlled by CLK is in a turned off state, while the second node NET2 maintains the high voltage signal from the phase t7 through the capacitor C. The signal constantly keeps the PMOS transistor M4 to be turned off, and the NMOS transistor M1 to be turned on, to continuously write the VGL signal to the first node NET1. The node (NET1) constantly keeps the PMOS transistor M2 to be turned on, to continuously write the VGH signal to the output terminal Output, and the PMOS transistor M5 controlled by the output terminal Output is in a constant off state, to ensure the stable signal of the first node NET1.

A phase t9 has the same operation principle with the phase t1, to ensure the output of VGL on the output terminal Output.

At a phase t10, STV is a low level voltage signal, and CLK is a high level voltage signal. At this time, the PMOS transistor M3 controlled by CLK is in a turned off state, while the second node NET2 maintains the low voltage signal from the phase t9 through C1. It may ensure that the PMOS transistor M4 is in a constant on state, and the NMOS transistor M1 in a constant off state. Thus, the VGL signal is continuously input to the output terminal Output through M4. The output terminal Output constantly keeps the PMOS transistor M5 to be turned on, to continuously write the VGH signal to the first node NET1, to ensure that the PMOS transistor M2 in a constant off state.

Operation between a phase t10 and a phase t21 is to repeat the operation of the phase t9 and the phase t10, to ensure the stable VGL output on the output terminal Output, till the next STV high level pulse. After a new STV high level pulse arrives, the operation between the phase t1 and the phase t11 is repeated. Thus, it may output a number of pulses at the output terminal according to the number of STV pulses, to achieve the output of multiple pulses of the CMOS shift register unit. Moreover, the pulse width of the output signal of the output terminal of the shift register unit may be adjusted by changing the pulse width of the frame start signal STV.

Compared with the circuit structure of the existing shift register unit, the novel constant-on type output CMOS shift register unit provided by the present embodiment has a more simply structure. By adjusting the pulse width of the STV trigger signal, it may control the output pulse width of the output signal, thus flexibly controlling pixel timing and the display effect. Moreover, compared to the conventional structure, the structure of the shift register may eliminate the instability of the signal from the control terminal of the high-level control circuit caused by jump of the control clock, and may improve the stability of the outputted high-level signals.

As shown in FIG. 4, the present embodiment also provides another shift register unit, which differs from the shift register unit as shown in FIG. 2 in that the first output module 12, the second input module 13, the second output module 14 and the reset module 15 are implemented as N type thin film transistors, the first input module 11 is implemented as a P type thin film transistor. That is, the types of the transistors are opposite. The connected high voltage signal VGH and the low voltage signal VGL are also interchanged. That is, in the present embodiment, the first input module 11 uses the first level voltage signal V1 as a high level voltage signal VGH, and the second input module 12 uses the second level voltage signal V2 as a low level voltage signal VGL.

Specifically, the first input module 11 includes a P type first thin film transistor M1, which has a first terminal inputted with a high level voltage signal VGH, a second terminal connected to the first node NET1, and a control terminal connected to the second node NET2. The first output module 12 includes an N type second thin film transistor M2, which has a first terminal inputted with a low level voltage signal VGL, a second terminal connected to the output terminal (Output) of the shift register unit, and a control terminal connected to the first node NET1. The second input module 13 includes an N type third thin film transistor M3, which has a control terminal connected to the first node NET1, a first terminal inputted with an input signal, and a second terminal connected to the second node NET2. The second module 14 includes an N type fourth thin film transistor M4, which has a first terminal receives a high level voltage signal VGH, a second terminal connected to the output terminal (Output) of the shift register unit, and a control terminal connected to the second node NET2. The reset module 15 includes an N type fifth thin film transistor M5, which has a first terminal inputted with a low level voltage signal VGL, a second terminal connected to the first node NET1, and a control terminal connected to the output terminal (Output) of the shift register unit.

The driving process for the above shift register unit may be referred to FIG. 5, which are similar to the driving process described in the above embodiments, which will not be repeated herein.

The shift register unit and the driving method thereof provided by the present disclosure, by selecting proper doped type of transistor, and making the transistors cooperate with each other, may achieve the function of the shift register unit of the present embodiment, and may simplify the structure. Moreover, by adjusting the pulse width of the STV trigger signal, it may control the width of the outputted waveform, thus flexibly controlling pixel timing and the display effect. Further, compared to the conventional structure, the structure of the shift register may eliminate the instability of the signal from the control terminal of the high-level control circuit caused by jump of the control clock, and may improve the stability of the outputted high-level signals.

An embodiment of the present disclosure also provides a driving circuit, including any of the above shift register units. The multiple shift register units are cascaded.

An embodiment of the present disclosure also provides a display device which provided with a driving circuit. The display device may be an electronic paper, an OLED panel, a mobile phone, a tablet computer, a television, a display, a notebook computer, a digital album, a navigation and any other product or component which has a display function.

Since the driving circuit and the display device provided by the present disclosure includes any of the above shift register units, the driving circuit has a simple structure. Moreover, by adjusting the pulse width of the STV trigger signal, it may control the width of the outputted waveform, thus flexibly controlling pixel timing and the display effect. Further, the output high voltage signal has good stability, and eventually the display device may have a better display effect. Since the driving circuit requires reduced number of transistors, the cost may be lowered.

In order for clear illustration, in the present disclosure, terms "first" and "second" are used to classify similar items. The terms "first" and "second" are not limited the number in the present disclosure, but are merely illustrative of an optional example. It will be apparent to those skilled in the art that the obvious variations or associated extensions which are contemplated by the present disclosure are within the scope of the present disclosure.

It will be understood by those of ordinary skill in the art that implementing all or part of the processes in the method of the embodiments described above may be accomplished by means of associated hardware instructed by a computer program which may be stored in a computer-readable storage medium. When being executed, the program may include the process in the above embodiments of the method. The storage medium may be a magnetic disk, an optical disk, a read-only memory (ROM), a random access memory (RAM), or the like'

The present disclosure provides a shift register unit and driving method thereof, driving circuit and display device. The shift register unit includes a first input module, a first output module, a second input module, a second output module, a storage capacitor and a reset module. Compared with the existing constant-on type shift register unit, the structure is simple. Under control of the first input module, the second input module and the reset module, the first and second output modules may output to the output terminal an output signal that satisfies the requirement (referring to the driving method for the shift register unit for detail). Moreover, by adjusting the pulse width of the STV trigger signal, it may control the width of the outputted waveform, thus flexibly controlling pixel timing and the display effect.

The foregoing are merely specific embodiments of the present disclosure and are not intended to limit the present disclosure. Those skilled in the art may conceive variations or substitutions within the range disclosed by the present disclosure which should be covered by the protection scope of the present disclosure. Therefore, the scope of the protection scope of the present disclosure should be defined by the protection scope of the claims.

What is claimed is:

1. A shift register unit, comprising: a first input module, a first output module, a second input module, a second output module, a storage capacitor and a reset module, wherein
    the first input module, the first output module and the reset module are connected together through a first node; the first input module, the second input module and the second output module are connected together through a second node; the storage capacitor has one terminal connected to the second node, and a second terminal connected to an output terminal of the shift register unit;
    the first input module is configured to receive a first level voltage signal, and under control of a voltage signal of the second node, transmit the first level voltage signal to the first node;
    the reset module is configured to receive a second level voltage signal, and under control of an output signal of the present stage of shift register unit, transmit the second level voltage signal to the first node;
    the first output module is configured to, under control of a voltage signal of the first node, output the second level voltage signal to the output terminal of the shift register unit;
    the second input module is configured to receive an input signal and under control of a clock signal, transmit the input signal to the second node;

the storage capacitor is configured to maintain the voltage of the second node while the second input module is turned off;

the second output module is configured to output the first level voltage signal to the output terminal of the shift register unit under control of a voltage signal of the second node; and one of the first level voltage signal and the second level voltage signal is a low level voltage signal, and the other is a high level voltage signal.

2. The shift register unit of claim 1, wherein the first input module comprises:

a first thin film transistor having a first terminal inputted with the first level voltage signal, a second terminal connected to the first node, and a control terminal connected to the second node.

3. The shift register unit of claim 1, wherein the first output module comprises:

a second thin film transistor having a first terminal inputted with the second level voltage signal, a second terminal connected to the output terminal of the shift register unit, and a control terminal connected to the first node.

4. The shift register unit of claim 1, wherein the second input module comprises:

a third thin film transistor having a control terminal inputted with the clock signal, a first terminal inputted with an input signal, and a second terminal connected to the second node.

5. The shift register unit of claim 1, wherein the second module comprises:

a fourth thin film transistor having a first terminal receiving the first level voltage signal, a second terminal connected to the output terminal of the shift register unit, and a control terminal connected to the second node.

6. The shift register unit of claim 1, wherein the reset module comprises:

a fifth thin film transistor having a first terminal inputted with the second level voltage signal, a second terminal connected to the first node, and a control terminal connected to the output terminal of the present stage of the shift register unit.

7. The shift register unit of claim 1, wherein the first output module, the second input module, the second output module and the reset module are implemented as thin film transistors of the same doped type, and the first input module is implemented as a thin film transistor of a different doped type from that of the first output module, the second input module, the second output module or the reset module.

8. The shift register unit of claim 1, wherein the first level voltage signal is a low level voltage signal, and the second level voltage signal is a high level voltage signal; and the first output module, the second input module, the second output module and the reset module are implemented as P type thin film transistors, and the first input module is implemented as an N type thin film transistor.

9. The shift register unit of claim 1, wherein the first level voltage signal is a high level voltage signal, and the second level voltage signal is a low level voltage signal; and the first output module, the second input module, the second output module and the reset module are implemented as N type thin film transistors, and the first input module is implemented as an P type thin film transistor.

10. A driving circuit, comprising a plurality of cascaded shift register units of claim 1.

11. A display device, provided with the driving circuit of claim 10.

12. A driving method for a shift register unit, applicable for the shift register unit comprising: a first input module, a first output module, a second input module, a second output module, a storage capacitor and a reset module, wherein the first input module, the first output module and the reset module are connected together through a first node; the first input module, the second input module and the second output module are connected together through a second node; the storage capacitor has one terminal connected to the second node, and a second terminal connected to an output terminal of the shift register unit;

the first input module is configured to receive a first level voltage signal, and under control of a voltage signal of the second node, transmit the first level voltage signal to the first node;

the reset module is configured to receive a second level voltage signal, and under control of an output signal of the present stage of shift register unit, transmit the second level voltage signal to the first node;

the first output module is configured to, under control of a voltage signal of the first node, output the second level voltage signal to the output terminal of the shift register unit;

the second input module is configured to receive an input signal and under control of a clock signal, transmit the input signal to the second node;

the storage capacitor is configured to maintain the voltage of the second node while the second input module is turned off;

the second output module is configured to output the first level voltage signal to the output terminal of the shift register unit under control of a voltage signal of the second node; and one of the first level voltage signal and the second level voltage signal is a low level voltage signal, and the other is a high level voltage signal, the first level voltage signal being a high level voltage signal, and the second level voltage signal being a low level voltage signal, the driving method comprising:

at a first phase, the input signal outputting a low level voltage, the clock signal outputting a low level voltage, the second input module transmitting a low level voltage signal to the second node and charging the storage capacitor to a low level voltage under control of the clock signal, the second output module outputting a low level voltage to the output terminal of the shift register unit under effect of the low level voltage of the second node, and the output terminal outputting a low level voltage to cause the reset module to turn off the first output module;

at a second phase, both of the input signal and the clock signal outputting high level voltages, the high level voltage of the clock signal causing the second input module to be turned off, and to stop transmitting a signal to the second node, due to the presence of the storage capacitor, the second node still maintaining the low level voltage, the second output module continuing to output a low level voltage to the output terminal, and the output terminal outputting a low level voltage to cause the reset module to turn off the first output module;

at a third phase, the input signal outputting a high level voltage, the clock signal CLK outputting a low level voltage, the second input module transmitting a high level voltage signal to the second node and charging the storage capacitor to a high level voltage under effect of the low level voltage of the clock signal, under effect of the high level voltage of the second node, the second output module being turned off, at the same time, the first input module transmitting a low level voltage signal to the first node, the first output module outputting a high level voltage to the output terminal of the shift register unit under effect of the low level voltage of the first node, and the output terminal outputting a high level voltage to turn off the reset module;

at a fourth phase, the input signal outputting a high level voltage, the clock signal outputting a high level voltage, the high level voltage of the clock signal causing the second input module to be turned off and to stop transmitting a signal to the second node, due to the presence of the storage capacitor, the second node still maintaining the high level voltage, and the first output module continuing to output a high level voltage to the output terminal of the shift register unit;

at a fifth phase, the input signal outputting a high level voltage, the clock signal alternately outputting a low level voltage and a high level voltage, similarly to the third phase and the fourth phase, the first output module continuing to output a high level voltage to the output terminal of the shift register unit till the input signal finishes outputting a high level voltage;

at a sixth phase, the input signal outputting a low level voltage, when the clock signal outputs a high level voltage, the high level voltage of the clock signal turning off the second input module, due to the presence of the storage capacitor, the second node still maintaining the high level voltage from the previous phase; the first output module continuing to output a high level voltage to the output terminal, subsequently, when the input signal continues to output a low level voltage, the clock signal outputting a low level voltage or a high level voltage, similarly to the first phase or the second phase, the second output module outputting a low level voltage to the output terminal; and when the input signal outputs a low level voltage, and the clock signal outputs a low level voltage, similarly to the first phase, the second output module outputting a low level voltage to the output terminal, subsequently, when the input signal continues to output a low level voltage, the clock signal outputting a high level voltage or a low level voltage, similarly to the second phase or the first phase, the second output module continuing to output a low level to the output terminal;

alternatively, when the first level voltage signal is a low level voltage signal, and the second level voltage signal is a high level voltage signal, the driving method comprises:

at a first phase, the input signal outputting a low level voltage, the clock signal outputting a high level voltage, the second input module transmitting a low level voltage signal to the second node and charging the storage capacitor to a low level voltage under effect of the high level voltage of the clock signal, the second output module turning off, and the first input module outputting a high level voltage to the first node under effect of the low level voltage of the second node, the first output module outputting a low level voltage to the output terminal of the shift register unit under effect of the high level voltage of the first node, the output terminal outputting a low level voltage to turn off the reset module;

at a second phase, the input signal outputting high level voltages, and the clock signal outputting a low level voltage, the low level voltage of the clock signal turning off the second input module, due to the presence of the storage capacitor, the second node still maintaining the low level voltage, the second output module continuing to be turned off, and the first output module continuing to output a low level voltage to the output terminal;

at a third phase, the input signal outputting a high level voltage, the clock signal CLK outputting a high level voltage, the second input module transmitting a high level voltage signal to the second node and charging the storage capacitor to a high level voltage under effect of the high level voltage of the clock signal, under effect of the high level voltage of the second node, the first input module being turned off; the second output module outputting a high level voltage to the output terminal, and the high level voltage outputted by the output terminal causing the reset module to turn off the first output module;

at a fourth phase, the input signal outputting a high level voltage, the clock signal outputting a low level voltage, the low level voltage of the clock signal causing the second input module to be turned off, due to the presence of the storage capacitor, the second node still maintaining the high level voltage, the second output module continuing to output a high level voltage to the output terminal, and the high level voltage outputted by the output terminal causing the reset module to continue to turn off the first output module;

at a fifth phase, the input signal outputting a high level voltage, the clock signal alternately outputting a high level voltage and a low level voltage, similarly to the third phase and the fourth phase, the second output module continuing to output a high level voltage to the output terminal of the shift register unit till the input signal finishes outputting a high level voltage;

at a sixth phase, the input signal outputting a low level voltage, when the clock signal outputs a high level voltage, the high level voltage of the clock signal causing the second input module to output a low level voltage to the second node, the second output module being turned off, the first output module outputting a low level voltage to the output terminal, subsequently, when the input signal outputs a low level voltage, the clock signal outputting a low level voltage or a high level voltage, and similarly to the second phase or the first phase, the first output module outputting a low level voltage to the output terminal of the shift register unit; and when the input signal outputs a low level voltage, and the clock signal outputs a low level voltage, due to the presence of the storage capacitor, the second node still maintaining the high level voltage from the previous phase, the second output module continuing to output a high level voltage to the output terminal, subsequently, when the input signal outputs a low level voltage, the clock signal outputting a high level voltage or a low level voltage, and similarly to the first phase or the second phase, the first output module continuing to output a low level to the output terminal.

13. The driving method of claim 12, wherein
a pulse width of an output signal of the output terminal is adjusted by adjusting a pulse width of the input signal.

14. The driving method of claim 12, wherein
the first level voltage signal is a low level voltage signal, the second level voltage signal is a high level voltage signal; the first output module, the second input module, the second output module and the reset module are implemented as P type thin film transistors, and the first input module is implemented as an N type thin film transistor;
when the second node is at a high level voltage, the P type thin film transistor of the second output module is turned off, the N type thin film transistor of the first input module is turned on to output a low level voltage to the first node, such that the P type thin film transistor of the first output module is turned on to output a high level voltage to the output terminal, the high level voltage outputted by the output terminal causes the P type thin film transistor of the reset module to be turned off; and
when the second node is at a low level voltage, the N type of thin film transistor of the first input module is turned off, the P type of thin film transistor of the second output module is turned on to output a low level voltage to the output terminal, the low level voltage outputted by the output terminal causes the P type of thin film transistor of the reset module to be turned on to output a high level voltage to the first node, such that the P type of thin film transistor of the first output module to be turned off.

15. The driving method of claim 12, wherein
the first level voltage signal is a high level voltage signal, the second level voltage signal is a low level voltage signal, the first output module, the second input module, the second output module and the reset module are implemented as N type thin film transistors, and the first input module is implemented as a P type thin film transistor;
when the second node is at a high level voltage, the P type thin film transistor of the first input module is turned off, the N type thin film transistor of the second output module is turned on to output a high level voltage to the output terminal, the high level voltage outputted by the output terminal causes the N type thin film transistor of the reset module to be turned on to output a low level voltage to the first node, such that the N type thin film transistor of the first output module is turned off;
when the second node is at a low level voltage, the N type of thin film transistor of the second output module is turned off, the P type of thin film transistor of the first input module is turned on to output a high level voltage to the first node, such that the N type thin film transistor of the first output module is turned on to output a low level voltage to the output terminal; the low level voltage outputted by the output terminal causes the N type of thin film transistor of the reset module to be turned off.

* * * * *